(12) United States Patent
Inagaki et al.

(10) Patent No.: US 12,121,996 B2
(45) Date of Patent: Oct. 22, 2024

(54) MICRO-OSCILLATOR, METHOD OF MANUFACTURING MICRO-OSCILLATOR, AND APPARATUS FOR PROCESSING MICRO-OSCILLATOR

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Yuuki Inagaki, Nisshin (JP); Yuji Ito, Kariya (JP); Yuki Ichihashi, Kariya (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 0 days.

(21) Appl. No.: 18/183,307

(22) Filed: Mar. 14, 2023

(65) Prior Publication Data

US 2023/0294210 A1   Sep. 21, 2023

(30) Foreign Application Priority Data

Mar. 16, 2022   (JP) .................................. 2022-041287

(51) Int. Cl.
*B23K 26/38* (2014.01)
*B23K 26/08* (2014.01)
*B23K 37/04* (2006.01)
*G01C 19/5691* (2012.01)
*H03B 5/02* (2006.01)

(52) U.S. Cl.
CPC .......... *B23K 26/38* (2013.01); *B23K 26/0823* (2013.01); *B23K 26/0869* (2013.01); *B23K 37/0443* (2013.01); *G01C 19/5691* (2013.01); *H03B 5/02* (2013.01)

(58) Field of Classification Search
CPC ................ G01C 19/5691; B23K 26/38; B23K 26/0823; B23K 26/0869
See application file for complete search history.

(56) References Cited

U.S. PATENT DOCUMENTS

| 10,612,925 B2 | 4/2020 | Najafi et al. | |
| 2014/0021561 A1* | 1/2014 | Trusov | ................ B81C 1/00134 257/415 |
| 2022/0049959 A1* | 2/2022 | Wu | ......................... B81B 7/007 |

FOREIGN PATENT DOCUMENTS

JP   2001-183960 A   7/2001

* cited by examiner

*Primary Examiner* — Jeffrey M Shin
(74) *Attorney, Agent, or Firm* — Posz Law Group, PLC (57) ABSTRACT

A method of manufacturing a micro-oscillator includes: preparing a substrate having a flat portion and a curved surface portion formed in a three-dimensional curved shape protruding from one surface of the flat portion, the curved surface portion being surrounded by the flat portion; and irradiating an outer surface of the curved surface portion with a laser beam to separate the curved surface portion from the flat portion.

6 Claims, 10 Drawing Sheets

MICRO-OSCILLATOR, METHOD OF MANUFACTURING MICRO-OSCILLATOR, AND APPARATUS FOR PROCESSING MICRO-OSCILLATOR

CROSS REFERENCE TO RELATED APPLICATION

This application is based on Japanese Patent Application No. 2022-041287 filed on Mar. 16, 2022, the disclosure of which is incorporated herein by reference.

TECHNICAL FIELD

The present disclosure relates to a micro-oscillator having a three-dimensional curved surface, a method of manufacturing the micro-oscillator, and a processing apparatus for the micro-oscillator.

BACKGROUND

A bird-bath resonator gyroscope (BRG) is proposed for realizing a highly sensitive inertial measurement unit (IMU). A vibrating body formed in a three-dimensional curved shape is mounted on a mounting substrate and is configured to oscillate in a wind glass mode.

SUMMARY

A method of manufacturing a micro-oscillator includes: preparing a substrate having a flat portion and a curved surface portion formed in a three-dimensional curved shape protruding from one surface of the flat portion, the curved surface portion being surrounded by the flat portion; and irradiating an outer surface of the curved surface portion with a laser beam to separate the curved surface portion from the flat portion.

DETAILED DESCRIPTION

In recent years, a system for self-driving of a vehicle has been developed. This type of system requires a highly accurate self-position estimation technology. For example, a self-position estimation system has been developed for so-called level 3 self-driving, which includes a global navigation satellite system (GNSS) and an inertial measurement unit (IMU). The IMU is, for example, a 6-axis inertial sensor composed of a 3-axis gyro sensor and a 3-axis acceleration sensor. In the future, in order to realize level 4 or higher self-driving, an IMU with higher sensitivity than the current one is required.

A bird-bath resonator gyroscope (BRG) is considered to be a promising gyro sensor for realizing such a highly sensitive IMU. A vibrating body formed in a three-dimensional curved shape is mounted on a mounting substrate and is configured to oscillate in a wind glass mode. A Q-value, which represents a vibration state, of this micro-oscillator reaches $10^6$ or more. Therefore, it is expected that this micro-oscillator enables to produce a higher sensitivity than a previous configuration.

As a method for manufacturing this type of micro-oscillator, for example, a glass substrate is attached to a mold, heated, and decompressed to form plural approximately hemispherical three-dimensional curved surfaces. After that, the glass substrate is attached to another mold, and a flat portion located between the curved surfaces is cut by laser processing to separate the micro-oscillators from each other.

The micro-oscillator manufactured by the above method has a flange at the tip end of the rim, in other words, the flat portion remains at the end of the substantially bowl-shaped curved surface portion. The flange remaining on the rim of the curved surface portion hinders the vibration of the curved surface portion, which causes a decrease in the Q-value, and hinders film formation when forming a surface electrode covering the outer and inner surfaces.

As another method for manufacturing a micro-oscillator, after forming a three-dimensional curved surface portion on a glass substrate by the same method as described above, the glass substrate is mounted on a jig, and sealed with resin. The flat portion is removed by grinding the outer peripheral portion of the curved surface portion of the glass substrate together with the jig and the resin. However, in this case, although it is possible to manufacture a micro-oscillator that does not have a flange on the rim of the curved surface portion, the number of processes increases, and the glass substrate is easily damaged in the resin sealing process and the subsequent grinding process, resulting in a decrease in yield.

The present disclosure provides a micro-oscillator that can be easily formed without having a flat portion on a rim of a curved surface portion having a three-dimensional curved surface shape, a method for manufacturing the micro-oscillator, and an apparatus for processing the micro-oscillator.

According to an aspect of the present disclosure, a method of manufacturing a micro-oscillator includes: preparing a substrate having a flat portion and a curved surface portion formed in a three-dimensional curved shape protruding from one surface of the flat portion, the curved surface portion being surrounded by the flat portion; and irradiating an outer surface of the curved surface portion with a laser beam to separate the curved surface portion from the flat portion.

In this manufacturing method, after preparing the substrate having the three-dimensional curved surface, the outer surface of the curved surface portion is irradiated with a laser beam, such that the flat portion and the three-dimensional curved surface portion are separated from each other to obtain the micro-oscillator. As a result, it is possible to obtain a micro-oscillator in which no flange remains on the three-dimensional curved surface portion, and the resin sealing and the subsequent grinding/polishing process becomes unnecessary, thereby improving the yield.

According to an aspect of the present disclosure, a micro-oscillator includes: a curved surface portion including an annular portion having an annular curved surface shape; and a connecting portion extending from a part of the curved surface portion located at a vertex of a virtual hemisphere partly formed of the annular portion toward a center of the virtual hemisphere. The curved surface portion has a rim at an end of the curved surface portion opposite to the connecting portion. The rim has a lower surface that connects a front side and a back side of the curved surface portion. The rim has a cylindrical shape, and the lower surface has a periodic concave-convex shape.

The micro-oscillator has the curved surface portion having the three-dimensional curved surface shape, and the connecting portion extending from the curved surface portion toward the center of the virtual hemisphere formed by the three-dimensional curved surface shape. The rim is cylindrical and does not have a flange. Further, the lower surface of the rim, which connects the front side and the back side of the curved surface portion, has the periodic concave-convex shape. As a result, it is possible to suppress a decrease in the Q-value and to suppress hindrance to the film formation when forming the surface electrode, both of which are caused by the flange in the micro-oscillator.

According to an aspect of the present disclosure, an apparatus for processing a micro-oscillator includes: a suction jig configured to suck a flat portion of a substrate having a curved surface portion surrounded by the flat portion and formed in a three-dimensional curved surface shape including a hemispherical shape protruding from one surface of the flat portion; a rotating mechanism configured to rotate the substrate sucked by the suction jig; a push jig having a head in contact with an outer surface of the curved surface portion of the substrate rotated by the rotating mechanism so as to adjust a rotational axis of the substrate; and a laser beam irradiation unit configured to irradiate the curved surface portion with a laser beam to cut the substrate.

This processing apparatus holds and rotates the substrate having the three-dimensional curved surface portion and the flat portion by the rotating mechanism. The push jig adjusts the rotational axis of the substrate. The curved surface portion is irradiated with a laser beam to cut the substrate so as to process the micro-oscillator. As a result, the micro-oscillator having the three-dimensional curved surface shape and no fringe can be obtained, and the conventional resin sealing and grinding/polishing steps are not required, thereby improving the yield.

The reference numerals attached to the components and the like indicate an example of correspondence between the components and the like and specific components and the like described in an embodiment to be described below.

Hereinafter, an embodiment of the present disclosure will be described with reference to the drawings. In the following embodiments, the same reference numerals are assigned to portions that are the same or equivalent to each other for description.

An inertial sensor 1 having a micro-oscillator 2 according to an embodiment will be described with reference to the drawings.

Figure 1:
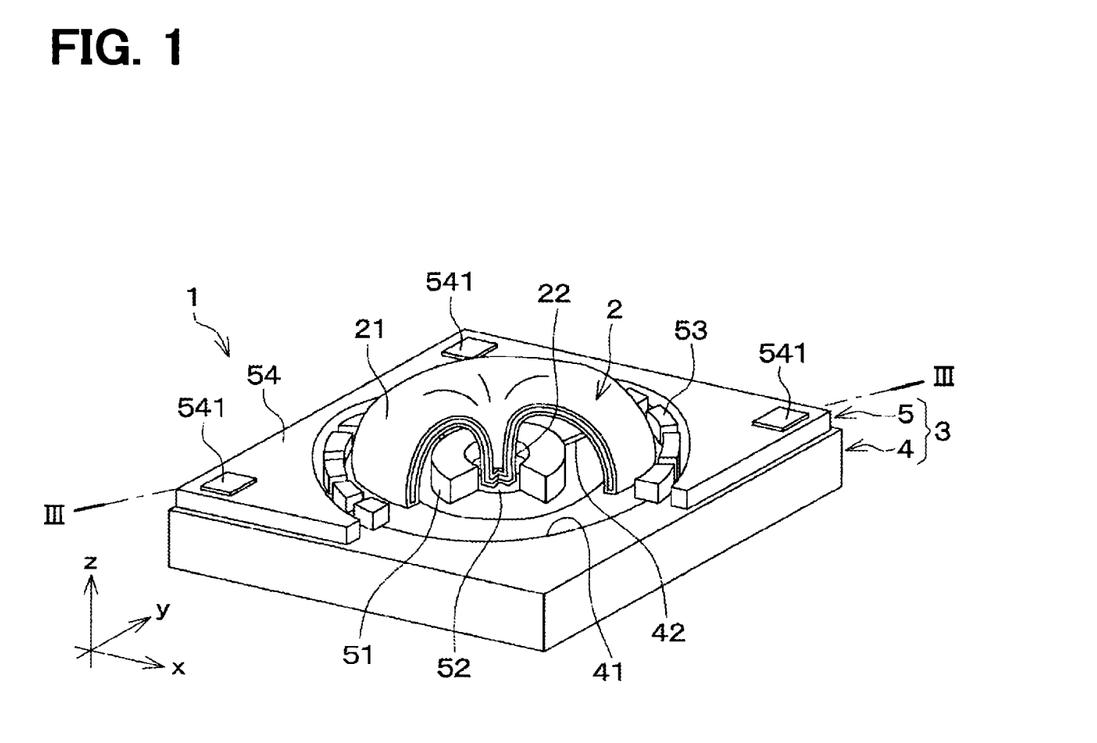
FIG. 1 is a perspective cross-sectional view showing an inertial sensor having a micro-oscillator according to an embodiment.
Figure 3:
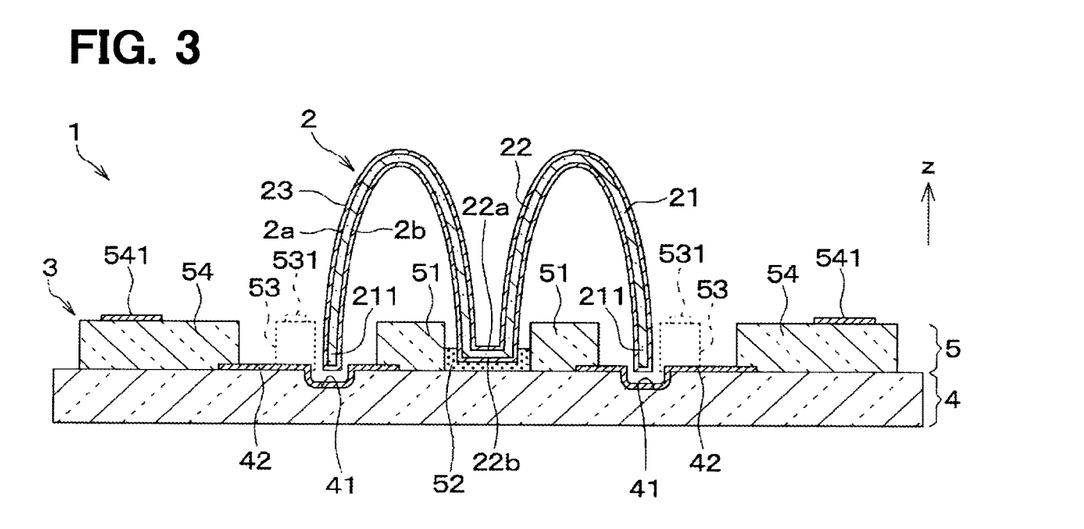
FIG. 3 is a cross-sectional view taken along line III-III in FIG. 1.

In FIG. 1, in order to make a configuration of the inertial sensor 1 easy to understand, a part of the micro-oscillator 2, a lower board 4, and an upper board 5 of the inertial sensor 1 is partially omitted, and a cross-section of the micro-oscillator 2 is partially shown. In FIG. 3, in order to facilitate understanding of the configuration of the inertial sensor 1, outlines of an electrode portion 53 and an electrode film 531, which will be described later, located on another cross-section are indicated by dashed lines. A mounting board 3 is formed by the lower board 4 and the upper board 5.

Hereinafter, for convenience of explanation, as shown in FIG. 1, one direction of a plane direction formed by the mounting board 3 is represented by x direction, and a direction perpendicular to the x direction in the plane direction is represented by y direction. A normal direction to the x-y plane is represented by z direction. The x, y, and z directions in FIG. 2 and subsequent drawings correspond to the x, y, and z directions in FIG. 1, respectively. In the present specification, an upper direction represents an upper side (arrow direction side) along the z direction in the drawings, and a lower direction represents an opposite direction opposite to the upper direction. Furthermore, in this specification, a top view means a state in which the inertial sensor 1, the micro-oscillator 2, or the mounting board 3 is viewed from the upper side in the z-direction.

As shown in FIG. 1, the micro-oscillator 2 is mounted on the mounting board 3 and used to configure an inertial sensor such as a gyro sensor like a BRG. The micro-oscillator 2 can also be adopted for other uses such as clock device. In this specification, the micro-oscillator 2 is used as a component of a BRG but is not limited to this use.

The inertial sensor 1 having the micro-oscillator 2 will be described. As shown in FIG. 1, the inertial sensor 1 includes the micro-oscillator 2 and the mounting board 3. A part of the micro-oscillator 2 is joined to the mounting board 3. The inertial sensor 1 is configured to detect an angular velocity applied to the inertial sensor 1 based on change in capacitance between a curved surface portion 21 of the micro-oscillator 2 capable of vibrating in wine glass mode and electrode portions 53 on the mounting board 3.

Figure 2:
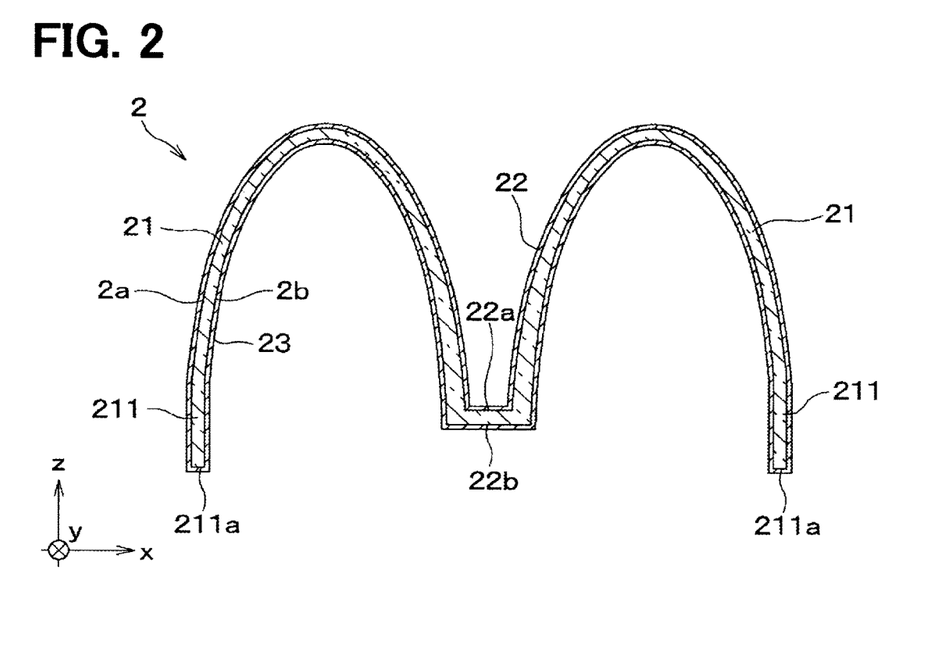
FIG. 2 is a cross-sectional view showing the micro-oscillator of the embodiment.

As shown in FIG. 2, the micro-oscillator 2 includes the curved surface portion 21 and a connecting portion 22. The curved surface portion 21 has a substantially hemispherical three-dimensional curved surface. The connecting portion 22 is extended from a vertex side of a virtual hemisphere formed by the curved surface portion 21 toward the center of the hemisphere. The connecting portion 22 is connected to another member such as the mounting board 3. The connecting portion 22 has, for example, a cylindrical recess shape with a bottom, but is not limited to this. The connecting portion 22 may have a column shape. The curved surface portion 21 may have a bowl-shaped three-dimensional curved surface. The micro-oscillator 2 may exhibit a Q value of vibration that is 105 or more.

A rim 211 is formed at the end of the curved surface portion 21 opposite to the connecting portion 22. The rim 211 has, for example, a substantially cylindrical shape. Note that the term "substantially cylindrical shape" as used herein includes not only a cylindrical shape in which the diameter is the same from the upper end to the lower end, between the outer surface and the inner surface of the rim 211, but also a cylindrical shape in which the diameter varies in a range from the upper end to the lower end. In other words, the curved surface portion 21 has the rim 211 that is an annular portion shaped in an annular curved surface. When the micro-oscillator 2 is mounted on the mounting board 3, the rim 211 has a front side 2a to face the electrode portions 53 on the mounting board 3, and the intervals between the electrode portions 53 are equal. The micro-oscillator 2 is a hollow portion so that the curved surface portion 21 including the rim 211 does not come into contact with other members when mounted on the mounting board 3. The rim 211 is configured to vibrate in a wine glass mode when the micro-oscillator 2 is mounted on the mounting board 3. The rim 211 is formed by cutting a three-dimensional curved surface portion of the substrate of the micro-oscillator 2 by laser light irradiation and has a shape without a flange. A method for manufacturing the micro-oscillator 2 will be described later. The micro-oscillator 2 has the curved surface portion 21 and the connecting portion 22. The curved surface portion 21 has a substantially hemispherical shape or a substantially bowl shape and has no flange on the rim 211. The connecting portion 22 has a bottomed tubular or substantially columnar shape extended from a center position of the curved surface portion 21 toward the inner surface in the top view.

As shown in FIGS. 2 and 3, the micro-oscillator 2 has the front side 2a having a larger outer diameter and a back side 2b opposite to the front side 2a. The micro-oscillator 2 has a surface electrode 23 covering part or all of the front side 2a and the back side 2b. The connecting portion 22 of the minute-oscillator 2 has a mounting surface 22b facing the mounting board 3, on the back side 2b. For example, a bottom surface of the connecting portion 22 of the micro-oscillator 2 opposite to the mounting surface 22b serves as a suction surface 22a used for suction-conveying the micro-oscillator 2.

The surface electrode 23 is composed of, for example, but not limited to, a laminated film of any conductive material such as Cr (chromium) or Ti (titanium) and Au (gold) or Pt (platinum) from the base side. The surface electrode 23 is formed as film on the front side 2a and the back side 2b of the micro-oscillator 2 by, for example, a vacuum film formation method such as sputtering or vapor deposition. The surface electrode 23 is formed, for example, at least on the mounting surface 22b and the front side 2a of the rim 211, which are electrically connected. The surface electrode 23 may have a solid shape that covers the entire front and back sides of the micro-oscillator 2 or may have a pattern shape that is patterned so as to partially covers the front and back sides. The micro-oscillator 2 is connected to the mounting board 3, for example, via a bonding member 52 made of a conductive material such as AuSn (gold tin) to cover a part of the surface electrode 23 on the mounting surface 22b of the connecting portion 22.

The micro-oscillator 2 is made of a material that can be laser processed, for example, quartz, glass containing additives such as borosilicate glass, metal glass, silicon, ceramic, or the like. Note that the micro-oscillator 2 is not limited to be made of the above material while the curved surface portion 21 and the connecting portion 22 are formed so as to vibrate in the wine glass mode. The micro-oscillator 2 is formed, for example, by processing a thin substrate made of the material described above in a formation process described later, so that the thickness of the curved surface portion 21 and the connecting portion 22 is in a range from 10 μm to 100 μm. The curved surface portion 21 and the connecting portion 22 are thin member in the order of micrometers. The micro-oscillator 2 has dimensions in millimeter-size. Specifically, the micro-oscillator 2 has a height dimension of 2.5 mm in a height direction along the thickness direction of the mounting board 3. The outer diameter of the micro-oscillator 2 on the front side 2a of the rim 211 is 5 mm.

As shown in FIG. 1, the mounting board 3 includes the lower board 4 and the upper board 5 joined to each other. For example, the mounting board 3 is formed as follows. An etching process and wiring film formation is performed to the lower board 4 made of borosilicate glass, which is an insulating material. Then attaching the upper board 5, which is made of Si (silicon) of a semiconductor material, to the lower board 4 so as to obtain anodic bonding and patterning. The mounting board 3 has an inner frame portion 51, the electrode portions 53 and an outer frame portion 54. The inner frame portion 51 is arranged on the upper board 5. The electrode portions 53 are arranged apart from each other so as to surround the inner frame portion 51. The outer frame portion 54 is separated from the electrode portions 53 to surround the electrode portions 53. The lower board 4 of the mounting board 3 has an annular etching groove 41 and a bridge wiring 42. The annular etching groove 41 surrounds the inner frame portions 51 while separating the inner frame portion 51 from the electrode portions 53. The bridge wiring 42 straddles the inner side and the outer side of the annular etching groove 41.

As shown in FIG. 3, the etching groove 41 is provided between the inner frame portion 51 and the electrode portions 53 and is formed by wet etching. The etching groove 41 has a dimension corresponding to the outer diameter of the rim 211 of the micro-oscillator 2. The etching groove 41 is provided such that the rim 211 is not in contact with the mounting board 3 when the micro-oscillator 2 is mounted on the mounting board 3.

The bridge wiring 42 is formed of a conductive material such as Al (aluminum) and is located between the electrode portions 53, which are electrically independent from each other. The bridge wiring 42 is provided to straddle the etching groove 41 on the lower board 4. One end of the bridge wiring 42 is connected to the inner frame portion 51 and the other end is connected to the outer frame portion 54 to make electric connection. As a result, the mounting board 3 can apply voltage to the surface electrode 23 of the micro-oscillator 2 via the outer frame portion 54, the bridge wiring 42 and the inner frame portion 51.

The inner frame portion 51 is formed together with the electrode portions 53 and the outer frame portion 54 by performing dry etching such as deep reactive ion etching (DRIE) on the upper board 5 anodically bonded to the lower board 4. The inner frame portion 51 has, for example, an annular shape when viewed from the upper side, and is configured such that the connecting portion 22 of the micro-oscillator 2 can be inserted or fitted into the area surrounded by the inner frame portion 51. For example, after arranging the bonding member 52 in a region surrounded by the inner frame portion 51 of the mounting board 3, the connecting portion 22 of the micro-oscillator 2 is mounted on the bonding member 52, and heated and solidified, such that the micro-oscillator 2 is mounted on the mounting board 3.

The electrode portions 53 are arranged apart from each other, and, for example, as shown in FIG. 3, an electrode film 531 is formed on each upper surface. For example, a wire (not shown) is connected to the electrode film 531, such that the electrode portions 53 are electrically connected to an external circuit board (not shown) to enable control of the potential. When the micro-oscillator 2 is mounted, the electrode portions 53 are separated from the rim 211 of the micro-oscillator 2 by a predetermined distance, and each of the electrode portions 53 forms a capacitor with the micro-oscillator 2. That is, the mounting board 3 is configured to detect the capacitance with the micro-oscillator 2 via the electrode portions 53 and to generate an electrostatic attractive force with the micro-oscillator 2 to enable to vibrate the micro-oscillator 2 in the wine glass mode.

The outer frame portion 54 has, for example, a single frame shape surrounding the inner frame portion 51 and the electrode portions 53 arranged therearound when viewed from the upper side. The outer frame portion 54 has, for example, at least one electrode film 541 made of Al or the like on its upper surface, and a wire (not shown) is connected to the electrode film 541.

The above is the basic configuration of the inertial sensor 1 having the micro-oscillator 2. The inertial sensor 1 described above is merely an example, and the mounting board 3 on which the micro-oscillator 2 is mounted may be changed depending on the number, shape, dimensions, and arrangement of the bridge wiring 42, the inner frame portion 51, the electrode portion 53, and the outer frame portion 54 as appropriate.

Next, a method of manufacturing the micro-oscillator 2 will be described. First, a step of processing the three-dimensional curved surface of the micro-oscillator 2 will be described.

Figure 4A:
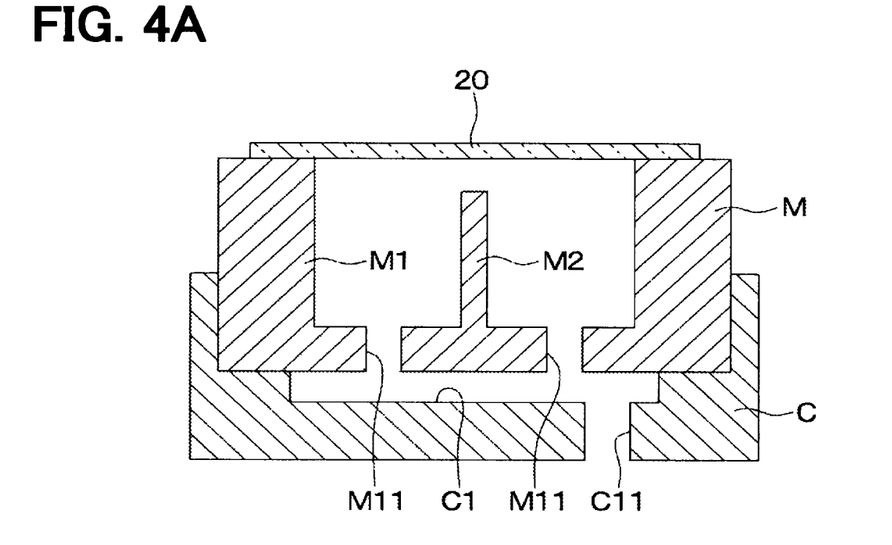
FIG. 4A is a diagram showing a step of preparing a material forming a micro-oscillator having a three-dimensional curved shape.

As shown in FIG. 4A, a quartz plate 20 is prepared as a base material made of a reflow material. Further, a mold M for forming a three-dimensional curved surface shape, and a cooling body C for cooling the mold M are prepared. Note that the reflow material forming the base material is not limited to quartz. The mold M has a recessed portion M1 and a support portion M2. The recessed portion M1 forms a space for forming the shape of the three-dimensional curved surface on the quartz plate 20. The support portion M2 is extended at the center of the recessed portion M1 along a depth direction of the recessed portion M1 to support a part of the quartz plate 20 during the processing time. The mold M has a through hole M11, for pressure reduction, formed in the bottom of the recessed portion M1. The cooling body C has a fitting portion C1, into which the mold M is fitted, and an exhaust port C11 formed on the bottom of the fitting portion C1 for exhausting gas. The cooling body C is configured to cool the mold M when the quartz plate 20 is processed. The quartz plate 20 is arranged so as to cover an entire area of the recessed portion M1 of the mold M.

Figure 4B:
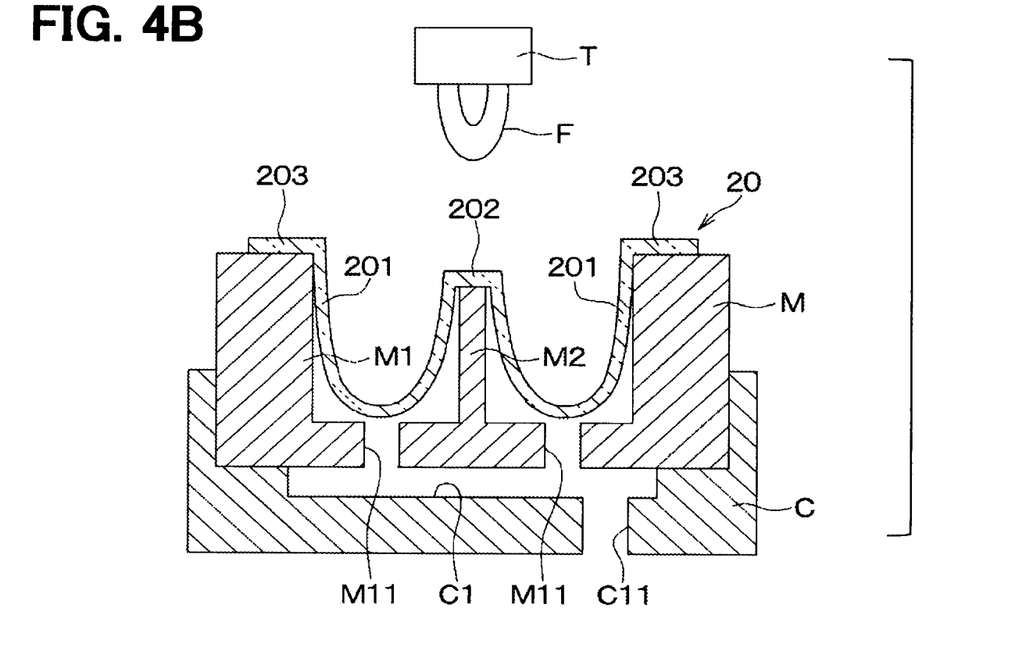
FIG. 4B is a diagram showing a step following the step of FIG. 4A.

As shown in FIG. 4B, a flame F is applied from a torch T toward the quartz plate 20 to melt the quartz plate 20. At this time, the recessed portion M1 of the mold M is evacuated through the exhaust port C11 of the cooling body C by a vacuum mechanism (not shown). As a result, the melted portion of the quartz plate 20 is stretched toward the bottom surface of the recessed portion M1, and a peripheral region of the melted portion of the quartz plate 20 is supported by the support portion M2. After that, by stopping the heating of the quartz plate 20 and cooling it, the quartz plate 20 is formed to have the curved surface portion 201 having a substantially hemispherical three-dimensional curved surface shape, and a concave portion 202 supported by the support portion M2, so that the concave portion 202 has a concave shape near the center of the curved surface portion 201. A part of the quartz plate 20 located outside the recessed portion M1 is a flat portion 203 located at the outer peripheral end of the curved surface portion 201 and having a flat shape. An inner peripheral portion surrounded by the flat portion 203 is the curved surface portion 201. The method of heating the quartz plate 20 is not limited to the above example, and any method such as radiation, heat transfer, convection, or induction heating may be employed.

Next, the recessed portion M1 of the mold M is returned to normal pressure, and the processed quartz plate 20 is removed from the mold M. The processed quartz plate 20 is attached to a processing apparatus 6 shown in FIG. 5.

Here, the processing apparatus 6 and a step of processing the quartz plate 20 using the processing apparatus 6 will be described with reference to FIGS. 5 to 6H.

Figure 6A:
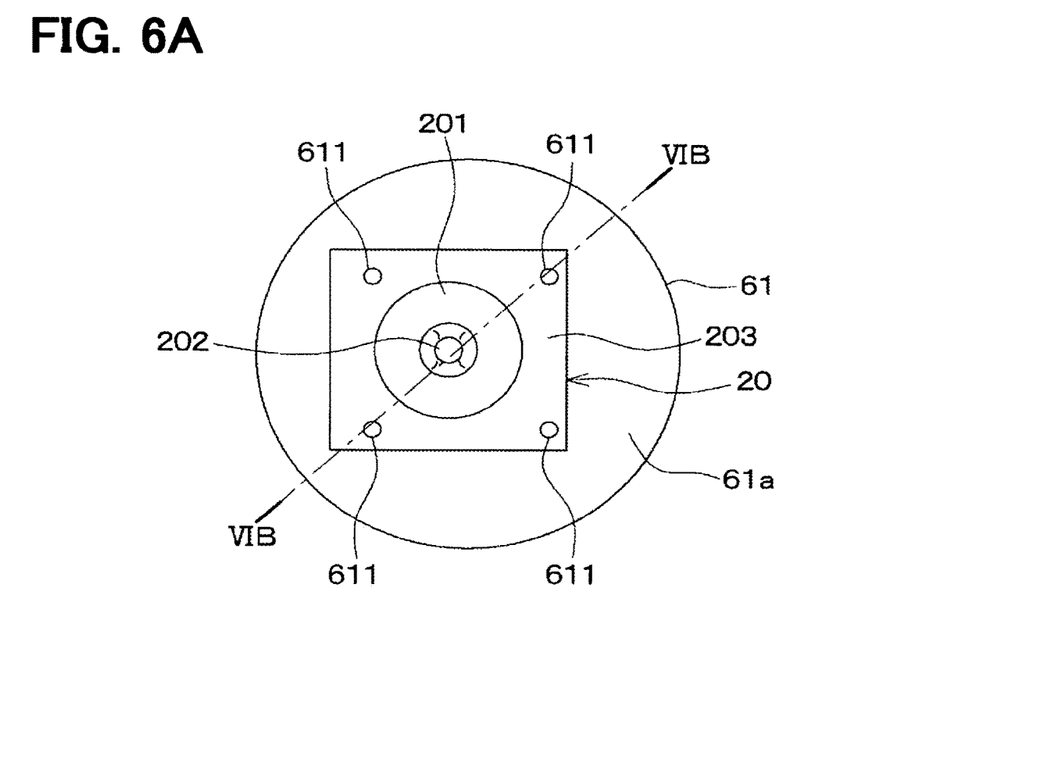
FIG. 6A is a diagram showing a step following the step of FIG. 4B.
Figure 6B:
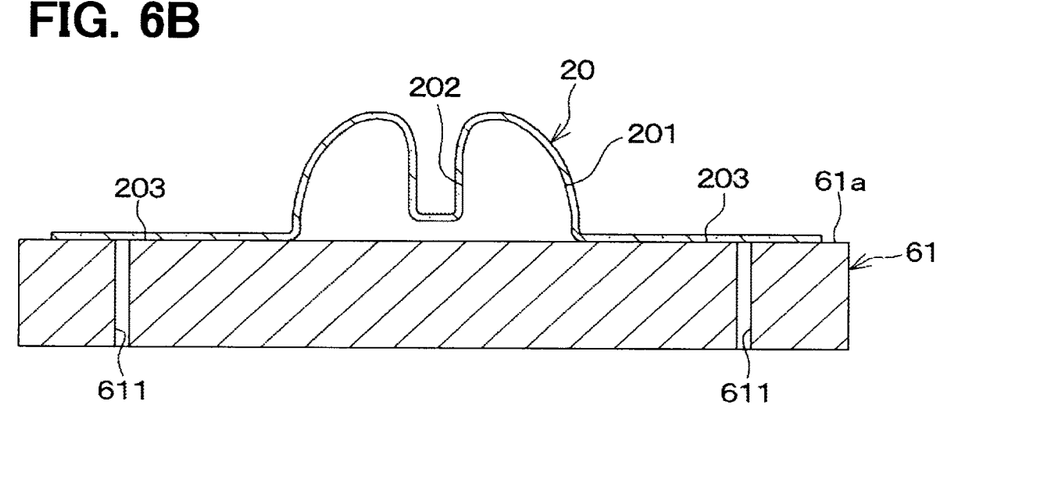
FIG. 6B is a cross-sectional view taken along line VIB-VIB in FIG. 6A.
Figure 6C:
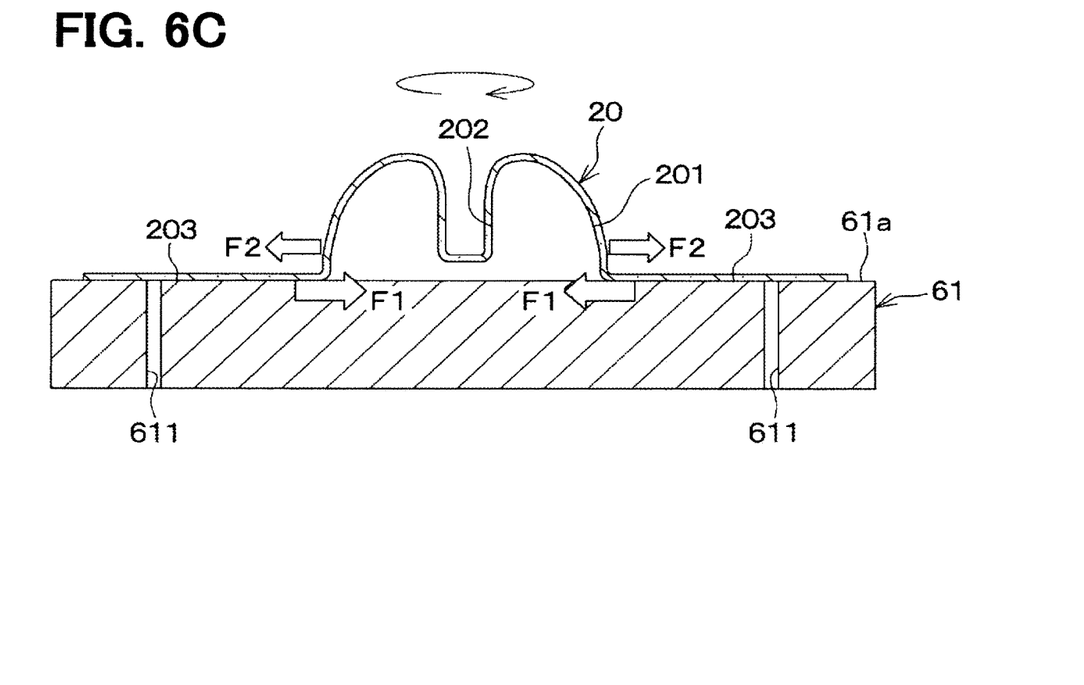
FIG. 6C is an explanatory diagram for explaining a frictional force and a centrifugal force applied to a substrate in the step pf manufacturing the micro-oscillator following FIG. 6B.
Figure 6D:
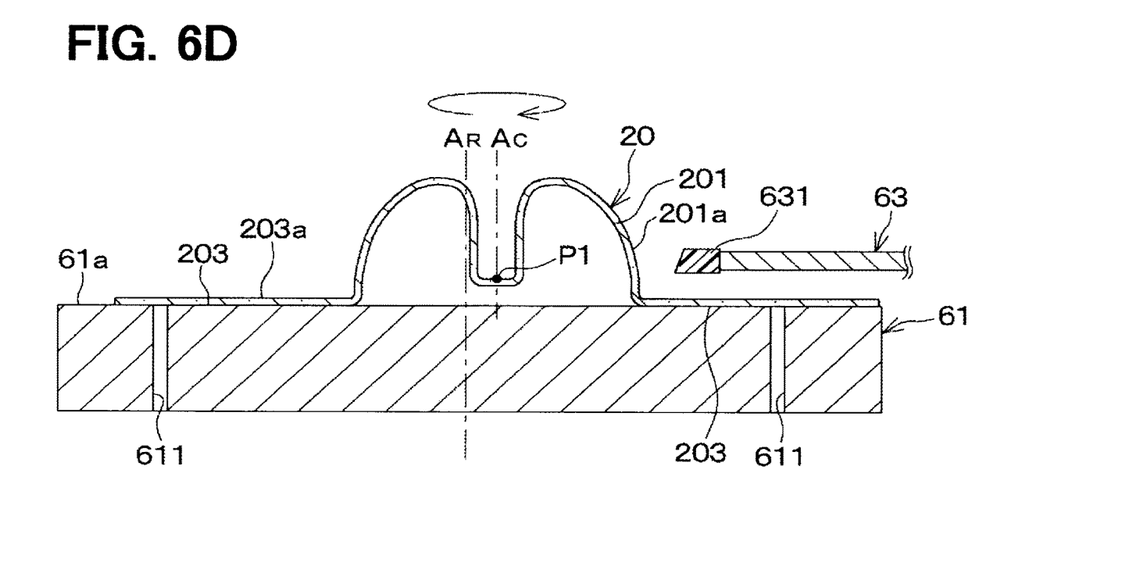
FIG. 6D is a diagram showing a case where a central axis of the substrate and a rotational axis of a rotating mechanism are misaligned in the step of manufacturing the micro-oscillator following FIG. 6B.
Figure 6E:
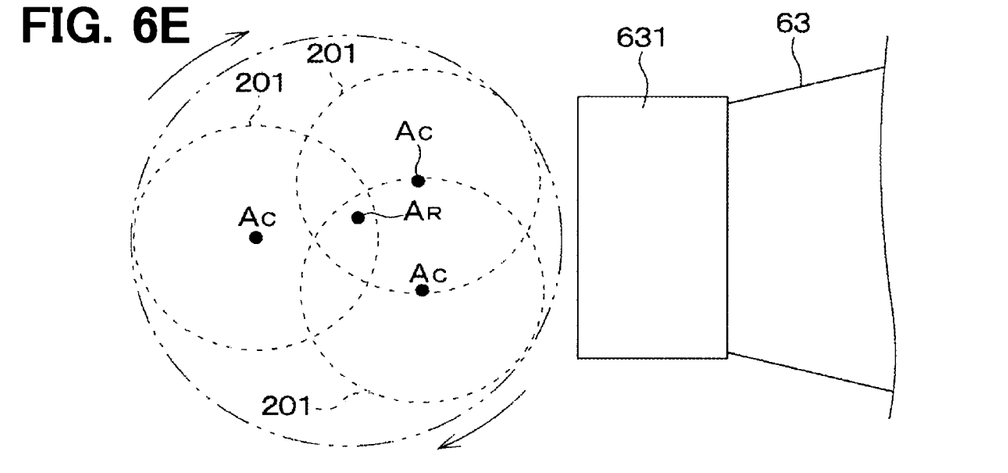
FIG. 6E is another view of FIG. 6D seen in a different angle.
Figure 6F:
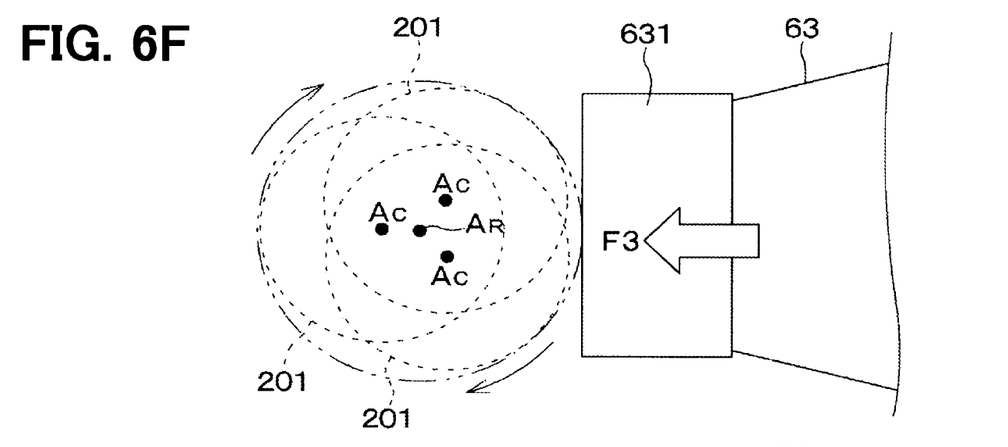
FIG. 6F is a view showing a step of manufacturing the micro-oscillator following FIG. 6E, corresponding to FIG. 6E.
Figure 6G:
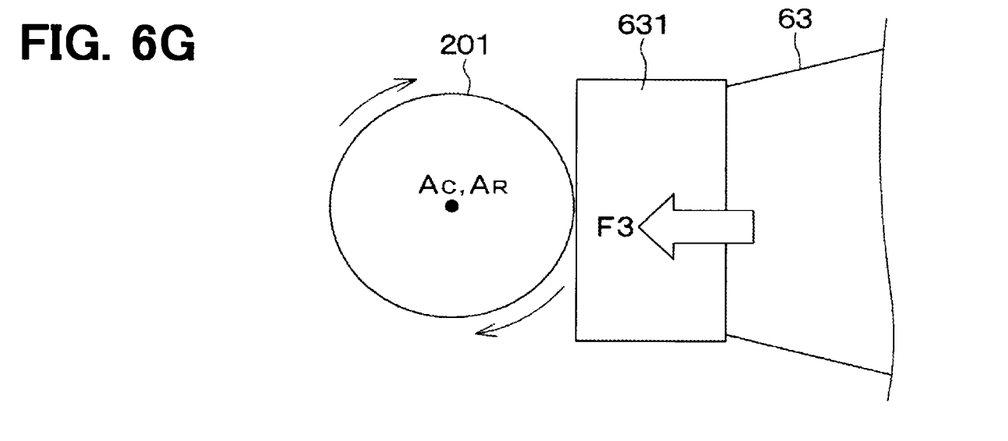
FIG. 6G is a view showing a step of manufacturing the micro-oscillator following FIG. 6F, corresponding to FIG. 6E.

In FIGS. 6A to 6H, a rotating mechanism 62 to which a suction jig 61 (to be described later) is attached and other mechanisms are omitted for the sake of clarity. FIGS. 6E to 6G show only the outline of the curved surface portion 201 and the central axis Ac of the quartz plate 20, and the suction jig 61 for holding the quartz plate 20 is omitted for the sake of clarity. In FIGS. 6E and 6F, the outline of the curved surface portion 201 of the quartz plate 20 in the rotating state is indicated by a broken line, and the orbit of the outermost contour of the curved surface portion 201 that revolves around the rotational axis $A_R$ of the rotating mechanism 62 is indicated by a double chain line. In FIGS. 6C, 6F, and 6G, the directions in which forces F1, F2, and F3, which will be described later, are indicated by blank arrows.

Figure 5:
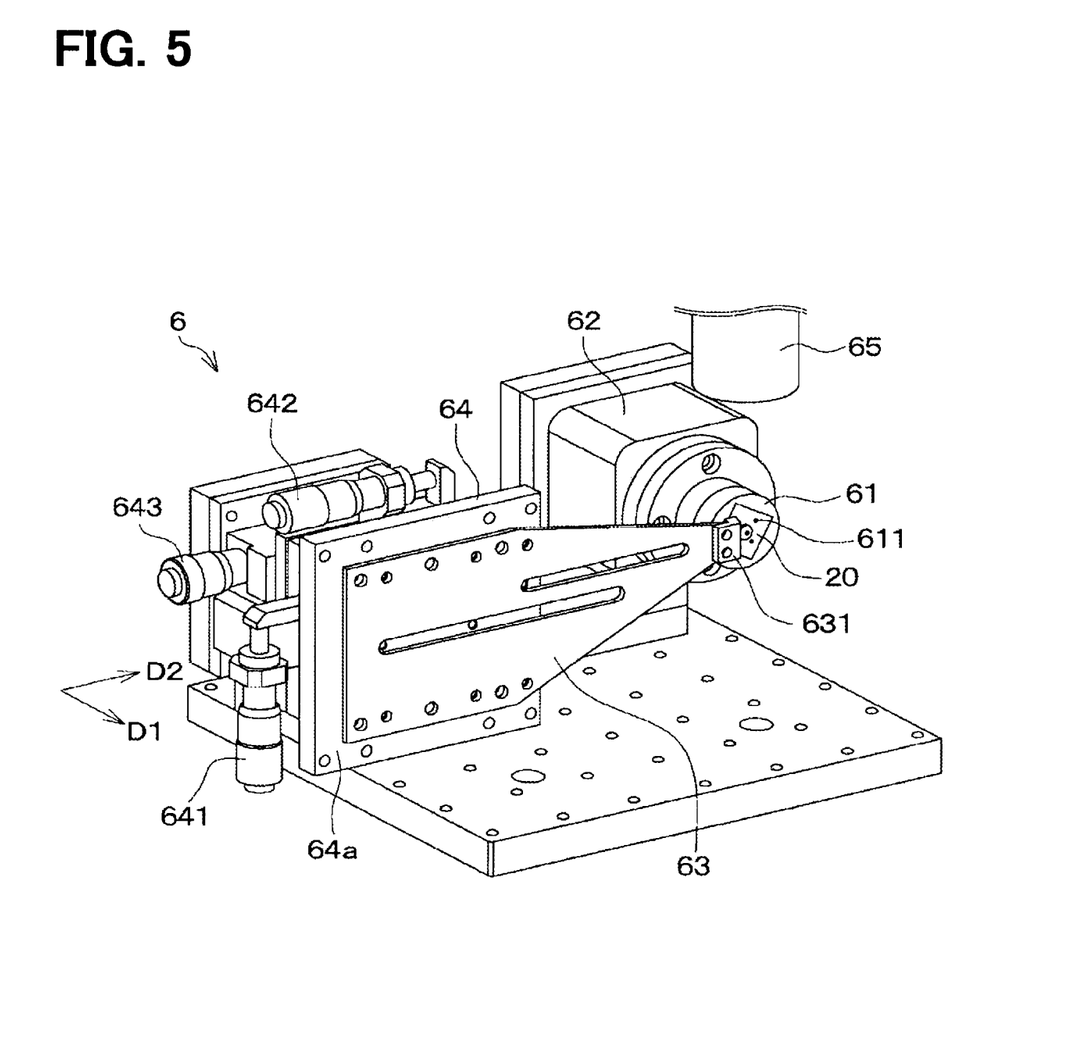
FIG. 5 is a perspective view showing an apparatus for processing the micro-oscillator.

As shown in FIG. 5, the processing apparatus 6 includes the suction jig 61 for chucking and holding the quartz plate 20, the rotating mechanism 62, a push jig 63, a pedestal 64 for the push jig 63, and a laser beam irradiation unit 65. The processing apparatus 6 is capable of rotating the quartz plate 20 by the rotating mechanism 62 while holding the quartz plate 20 by the suction jig 61. In the processing apparatus 6, for example, the pedestal 64 can be adjusted in height position, push amount, and horizontal degree by a height adjustment screw 641, a push amount adjustment screw 642, and a horizontal adjustment screw 643, respectively. As a result, in the processing apparatus 6, the relative position of the push jig 63 with respect to the suction jig 61 is adjusted, and the position of the quartz plate 20 can be adjusted by pushing the rotating quartz plate 20 with the push jig 63. The details of position adjustment of the quartz plate 20 by the push jig 63 will be described later. After adjusting the position of the quartz plate 20 with respect to the rotating shaft of the rotating mechanism 62, the processing apparatus 6 irradiates the curved surface portion 201 of the rotating quartz plate 20 with a laser beam from the laser beam irradiation unit 65 to perform cutting.

As shown in FIG. 5, a height direction D1 is defined along the normal direction to the mounting surface 64a of the pedestal 64 to which the push jig 63 is attached. The "height position" of the pedestal 64 indicates the position of the pedestal 64 in the height direction D1. A pushing direction D2 is one direction along a plane formed by the mounting surface 64a, and is defined from the pedestal 64 toward the rotating shaft of the rotating mechanism 62. The "push amount" of the pedestal 64 refers to the amount of movement of the pedestal 64 in the pushing direction D2 before and after the adjustment by the push amount adjustment screw 642. The "horizontal degree" of the pedestal 64 means the horizontal degree of the mounting surface 64a.

The suction jig 61 includes a suction hole 611 for holding the prepared base material (quartz plate 20), as shown in FIGS. 6A and 6B. The suction hole 611 of the suction jig 61 is connected to a vacuum mechanism (not shown) so that the suction hole 611 can hold the flat portion 203 of the quartz plate 20 by vacuum suction. The suction jig 61 is attached to the rotating mechanism 62 by an arbitrary method such as screwing, and is rotatable by the rotating mechanism 62 while vacuum-sucking the quartz plate 20.

At this time, as shown in FIG. 6C, a frictional force F1 is generated between the quartz plate 20 and the suction jig 61, and a centrifugal force F2 is applied to the quartz plate 20 by rotation. The suction jig 61 adsorbs the quartz plate 20 to satisfy F1≥F2. Note that F1 and F2 are represented by the following formulas.

$$F1 = m(r2\pi n)2/r$$

$$F2 = \mu N$$

The π, m, r, and n are a circular constant, a mass (unit: kg) of the quartz plate 20, a radius of gyration (unit: m) of the quartz plate 20, and the number of revolutions (unit: $s^{-1}$) of the quartz plate 20, respectively. The p and N are a coefficient of static friction between the quartz plate 20 and the suction jig 61 and a normal force (unit: N) applied to the quartz plate 20, respectively.

The rotating mechanism 62 is, for example, a motor, and rotates the suction jig 61. The rotational speed r of the quartz plate 20 by the rotating mechanism 62 is appropriately adjusted so as to satisfy F1≥F2.

The push jig 63 has a head 631 that contacts the outer surface 201a of the curved surface portion 201 of the rotating quartz plate 20, so as to adjust the position of the quartz plate 20 with respect to the rotational axis $A_R$ of the rotating mechanism 62.

Specifically, as shown in FIG. 6D, the rotational axis $A_R$ of the rotating mechanism 62 and the central axis Ac of the curved surface portion 201 of the quartz plate 20 may be shifted from each other when viewed from the normal direction to the suction surface 61a of the suction jig 61. Note that the central axis Ac of the curved surface portion 201 is an axis along the normal direction and passing through the center point P1 located at the center of the curved surface portion 201, when the quartz plate 20 having the curved surface portion 201 formed thereon is viewed in the direction normal to the one surface 203a of the flat portion 203.

If the quartz plate 20 is rotated in a state where the rotational axis $A_R$ of the rotating mechanism 62 and the central axis Ac of the curved surface portion 201 of the quartz plate 20 are displaced, as shown in FIG. 6E, the central axis Ac of the quartz plate 20 revolves around the rotational axis $A_R$. In this state, the centrifugal force applied to the quartz plate 20 is large. Further, the focal length of the laser beam fluctuates in the step of separating the curved surface portion 201 and the flat portion 203 by laser beam irradiation, which will be described later. Therefore, the rotating quartz plate 20 is pushed by the push jig 63 to change the suction position of the suction jig 61 so that the central axis Ac of the quartz plate 20 coincides with the rotational axis $A_R$ of the rotating mechanism 62.

Hereinafter, in this specification, for convenience, the series of steps shown in FIGS. 6D to 6G is called a "centering process" so that the central axis Ac of the quartz plate 20 coincides with the rotational axis $A_R$ of the rotating mechanism 62.

More specifically, in the centering process, for example, the push jig 63 is moved by the push amount adjustment screw 642. As shown in FIG. 6F, the outer surface 201a of the rotating quartz plate 20 is pushed toward the rotational axis $A_R$ by one surface of the head 732 made of material such as resin. At this time, the head 631 presses the curved surface portion 201 of the quartz plate 20 with a force F3 that is larger than the frictional force F2 and within a range not exceeding the strength of the curved surface portion 201. As a result, the quartz plate 20 is gradually moved by the suction surface 61a while being held by the suction jig 61 so that the central axis Ac of the curved surface portion 201 approaches the rotational axis $A_R$ of the rotating mechanism 62. Then, by further pushing the quartz plate 20 toward the rotational axis $A_R$ with the head 631, finally, as shown in FIG. 6G, the central axis Ac of the quartz plate 20 coincides with the rotational axis $A_R$ of the rotating mechanism 62. As a result, the quartz plate 20 rotates around the central axis Ac of the curved surface portion 201, reducing the centrifugal force applied to the curved surface portion 201 and stabilizing the rotating state.

In the centering process, the position of the push jig 63 can be adjusted until the central axis Ac and the rotational axis $A_R$ substantially coincide with each other while confirming the rotation state of the quartz plate 20 by an imaging device such as a camera (not shown). As a result, after adjusting the position of the quartz plate 20 with respect to the rotational axis $A_R$, it is possible to smoothly proceed to the next laser processing by the laser beam irradiation unit 65, thereby shortening the processing time.

The laser beam irradiation unit 65 is a laser device capable of intermittently irradiating a laser beam of a predetermined wavelength with a predetermined spot diameter. The laser beam irradiation unit 65 may irradiate a laser beam in the infrared region (for example, a wavelength of 1 μm to 1 mm) such as $CO_2$ laser. The laser beam irradiation unit 65 may irradiate a laser beam in the ultraviolet region to the near-infrared region (for example, a wavelength of 0.3 μm to 1 μm) such as a femtosecond laser. The laser beam irradiation unit 65 can be changed as appropriate according to the reflow material to be used.

Figure 6H:
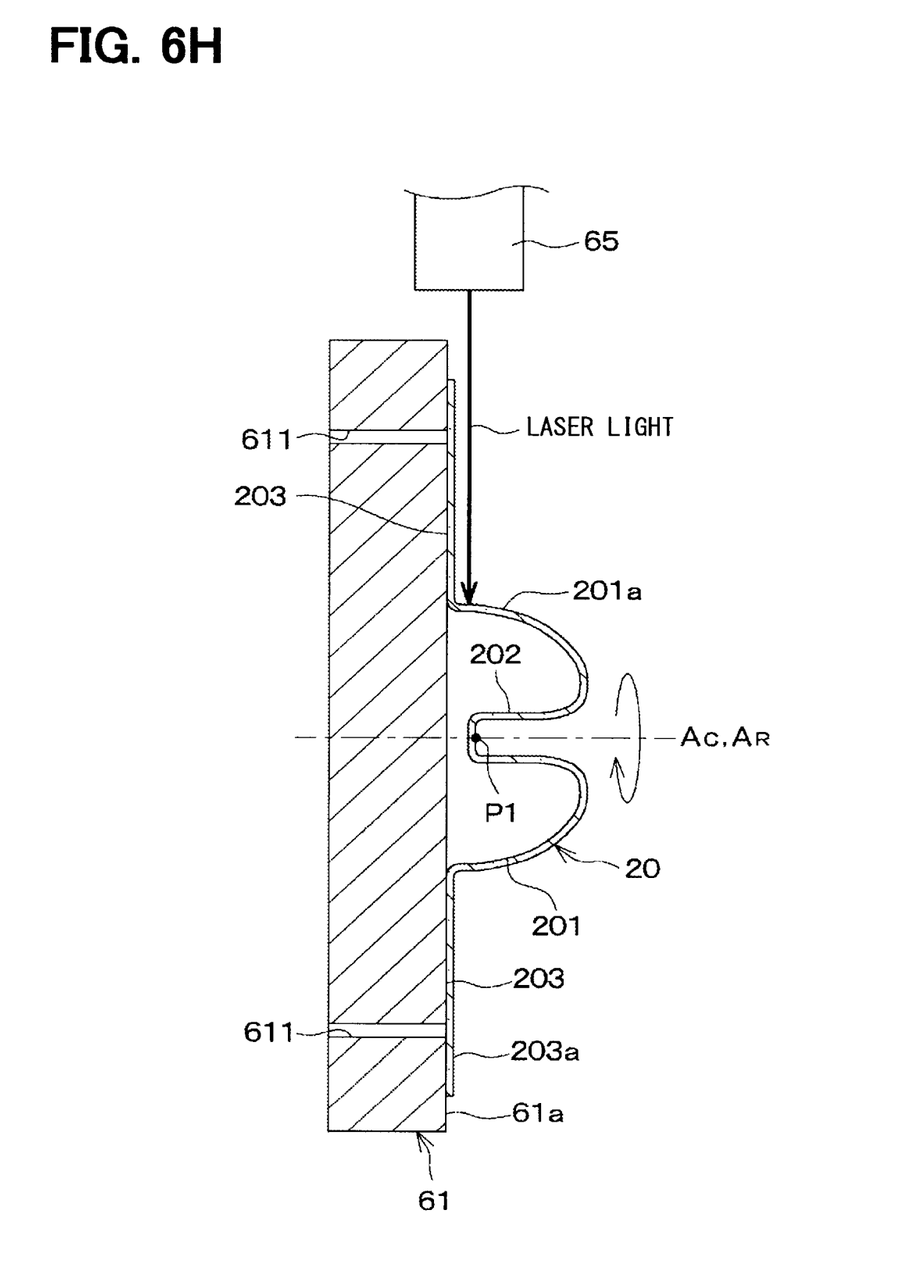
FIG. 6H is a diagram showing a step following the step of FIG. 6G.

As shown in FIG. 6H, the laser beam irradiation unit 65 intermittently irradiates the curved surface portion 201 of the rotating quartz plate 20 with a laser beam after the centering process. By repeating this process, the curved surface portion 201 of the quartz plate 20 is cut along the circumferential direction about the rotational axis $A_R$, and the flat portion 203 and the curved surface portion 201 are separated. The portion separated from the quartz plate 20 by the cutting process using this laser beam irradiation becomes the micro-oscillator 2 according to the embodiment. Since the rim 211 of the micro-oscillator 2 is formed by the above-described cutting process using a laser beam, the outer surface of the rim 211 has no flange protruding in a radial direction about the central axis Ac or in a direction intersecting the outer surface.

The three-dimensional curved surface shape of the curved surface portion 21 and the connecting portion 22 of the micro-oscillator 2 are obtained by setting a base material made of a reflow material in the mold M and heating and softening, as shown in FIGS. 4A and 4B, and performing a decompression process. Then, as shown in FIGS. 6D to 6H, the base material on which the curved surface portion 201, the concave portion 202 and the flat portion 203 are formed is fixed by suction and rotated. After adjusting the position with respect to the rotational axis, laser processing is performed to obtain the curved surface portion 21 in which the rim 211 has no flange. After that, by forming the surface electrode 23 on the front side and the back side by sputtering or the like, the micro-oscillator 2 can be manufactured.

As a result, the conventional resin sealing and grinding processes for removing the flange become unnecessary. Since the curved surface portion 21 having no flange on the rim 211 can be easily formed, the yield can be increased in manufacturing the micro-oscillator 2. In addition, since the rim 211 does not have a flange, when the surface electrode 23 is formed on the micro-oscillator 2, the flange does not interfere with the film formation, and the film formation of the surface electrode 23 is stabilized.

Figure 7:
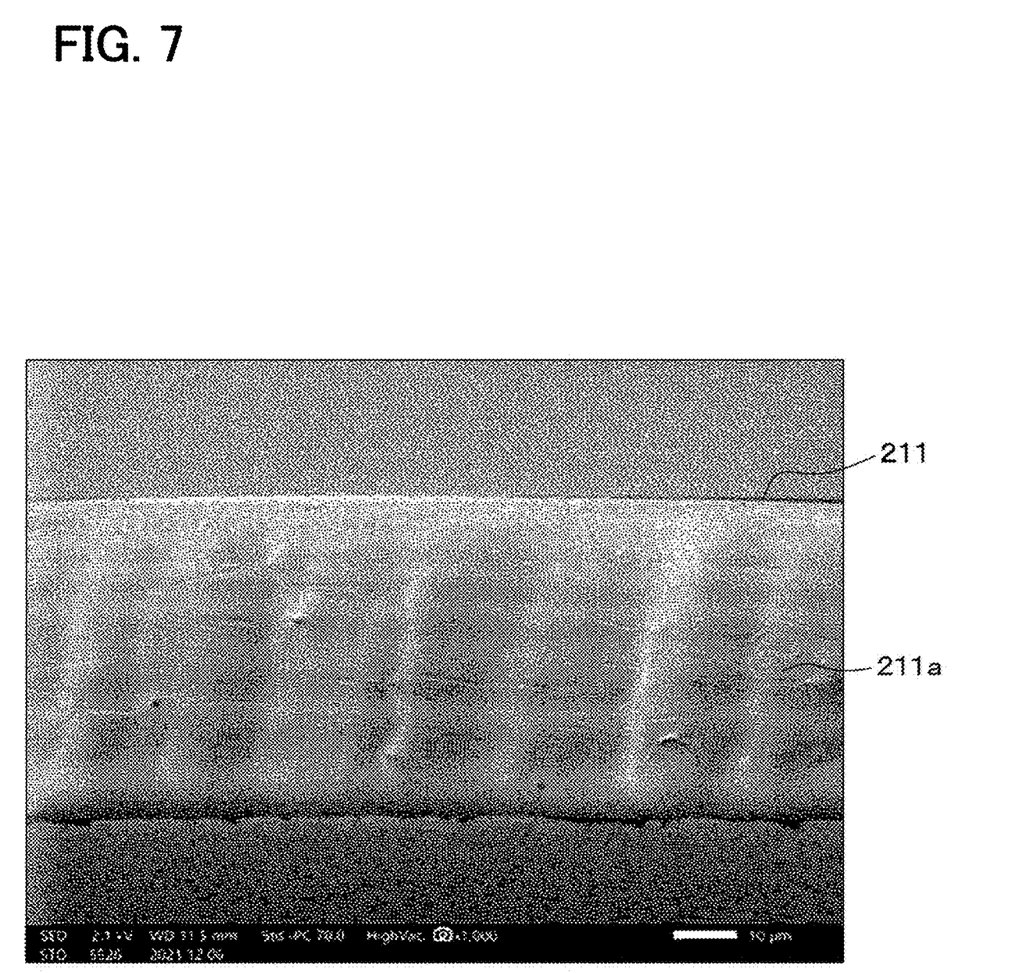
FIG. 7 is a view showing an observation result of scanning electron microscope (SEM) of a lower surface of a rim of the micro-oscillator formed by the step of FIG. 6G.

A cut surface of the micro-oscillator 2 formed by the laser beam irradiation, that is, a lower surface 211a of the rim 211 connecting the front side 2a and the back side 2b, has periodic irregularities, for example, as shown in FIG. 7, with a wavy shape. The uneven shape has, for example, protrusions and recesses repeatedly arranged, in which a height difference between the protrusion and the recess has the order of nanometers or micrometers, and a width of the protrusion and the recess is several μm to several tens of μm. This uneven shape is caused by intermittently repeating cutting by laser irradiation.

The height difference between the protrusion and the recess in the uneven shape of the lower surface 211a of the rim 211 and the width of the protrusion or the recess can be adjusted by changing irradiation conditions such as the irradiation time of one laser light, the number of irradiations per second, the wavelength, and the energy density. By adjusting the height difference and the width in the lower surface 211a of the rim 211, the micro-oscillator 2 can be designed to have a desired vibration Q value while maintaining the resonance frequency of the oscillator at a predetermined value. Further, if the electrode portion 53 is arranged to face the lower surface 211a of the rim 211, the facing area between the electrode portion 53 and the rim 211 can be increased so as to increase the capacitance.

According to the embodiment, a substrate having a three-dimensional curved surface is rotated while being sucked and held. After the central axis Ac of the curved surface portion 201 of the substrate is aligned with the rotational axis $A_R$ of the rotating mechanism 62, the curved surface portion 201 is separated from the flat portion 203 by laser processing, so as to obtain the micro-oscillator 2. Therefore, it is possible to obtain the micro-oscillator 2 having a structure in which a flange does not remain on the three-dimensional curved surface. The resin sealing and subsequent grinding and polishing processes become unnecessary, and the film of the surface electrode 23 can be stably formed. Thus, the yield is improved. In addition, since the lower surface 211a of the rim 211 has a periodic uneven shape, the micro-oscillator 2 can be designed to have a desired Q value without changing the resonance frequency by adjusting the height difference and width of the unevenness.

Figure 8:
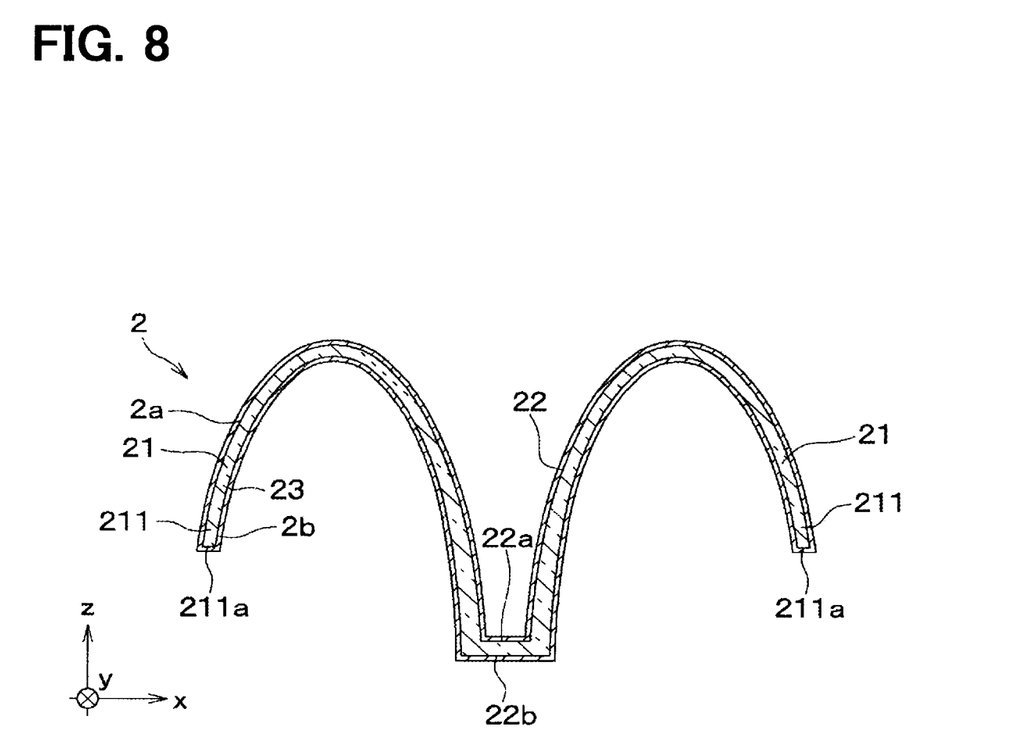
FIG. 8 is a cross-sectional view showing a modification of the micro-oscillator, corresponding to FIG. 2.

As a modification, as shown in FIG. 8, the micro-oscillator 2 can be configured such that the lower surface 211a of the rim 211 is located at the upper side of the mounting surface 22b of the connecting portion 22 in the z direction. In other words, in the micro-oscillator 2, the connecting portion 22 protrudes downward than the rim 211. This micro-oscillator 2 cannot be manufactured by the conventional method in which the three-dimensional curved surface is formed and then resin-sealing and grinding processes are performed. However, this micro-oscillator 2 is easily manufactured by changing the laser irradiation position by the laser beam irradiation unit 65 shown in FIG. 6H.

According to the modification, the micro-oscillator 2 can obtain the same effects as those of the above-described embodiment. In addition, since the connecting portion 22 protrudes downward than the rim 211, the length of the rim 211 is relatively shortened. The structure is resistant to external vibrations, by increasing the resonance frequency that causes unintended and unnecessary vibrations. Furthermore, since the position of the lower surface 211a of the rim 211 in the z-direction is higher than the mounting surface 22b of the connecting portion 22, it is not necessary to form the etching groove 41 in the mounting board 3. Thus, the mounting board 3 can be designed more freely.

Although the present disclosure has been described in accordance with the embodiment, it is understood that the present disclosure is not limited to such embodiments or structures. The present disclosure also includes various modifications and modifications within an equivalent range. In addition, various combinations and modes, and further, other combinations and modes including one element of these alone, or thereabove, or therebelow, are also comprised within the scope or concept range of the present disclosure.

(1) For example, in the above embodiment, the head 631 of the push jig 63 of the processing apparatus 6 has a substantially rectangular plate shape, but is not limited to this. The head 631 may have a curved shape that enables the centering process, which is in contact with the curved surface portion 201 of the substrate (for example, the quartz plate 20), corresponding to the outer shape of the curved surface portion 201. Further, the head 631 may have a protrusion projecting from the other part so as to abut on the curved surface portion 201. In this case, the protrusion may be configured to retract into the base when a force greater than or equal to a predetermined amount is applied, such that an excess force F3 is not applied to the curved surface portion 201. As described above, the shape and configuration of the head 631 may be appropriately changed according to the outer diameter and strength of the curved surface portion 201 of the substrate.

(2) In FIG. 5, the height, push amount, and horizontal degree of the pedestal 64 of the processing apparatus 6 can be manually adjusted by the screws 641 to 643, but not limited to this. For example, the processing apparatus 6 may be configured such that the height of the pedestal 64 or the push jig 63 can be automatically adjusted by any mechanical mechanism.

(3) In the embodiment, the curved surface portion 201 and the concave portion 202 are cut and separated from other portions by fixing the laser beam irradiation unit 65 and rotating the substrate (for example, the quartz plate 20), but not limited to this. For example, while the substrate is fixed, the laser beam irradiation unit 65 is moved to irradiate the curved surface portion 201 with the laser beam along the circumferential direction with respect to the central axis Ac of the substrate. In this case, the processing apparatus 6 has, for example, a moving mechanism (not shown) that moves the laser beam irradiation unit 65 around the curved surface portion of the substrate along the circumferential direction.

(4) The constituent element(s) of each of the above embodiments is/are not necessarily essential unless it is specifically stated that the constituent element(s) is/are essential in the above embodiment, or unless the constituent element(s) is/are obviously essential in principle. Further, in each of the embodiments described above, when numerical values such as the number, numerical value, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number. Further, in each of the above embodiments, when the shape of an element or the positional relationship between elements is mentioned, the present disclosure is not limited to the specific shape or positional relationship unless otherwise particularly specified or unless the present disclosure is limited to the specific shape or positional relationship in principle.

What is claimed is:

1. A method of manufacturing a micro-oscillator, comprising
    preparing a substrate having a flat portion and a curved surface portion formed in a three-dimensional curved shape protruding from one surface of the flat portion, the curved surface portion being surrounded by the flat portion, and
    irradiating an outer surface of the curved surface portion with a laser beam to separate the curved surface portion from the flat portion, wherein:
    the curved surface portion has a central axis passing through a center point of the curved surface portion, when viewed in a normal direction to the one surface, along the normal direction,
    the irradiating includes:
        holding the substrate by adsorbing the flat portion of the substrate,
        rotating the substrate about the central axis as a rotational axis, and
        irradiating the laser beam while the substrate is rotating,
    the flat portion of the substrate is held by vacuum suction in the holding, and
    the rotating of the substrate includes:
        pressing the outer surface of the substrate in a rotating state by a push jig,
        adsorbing and moving the substrate toward a rotational axis of a rotating mechanism for rotating the substrate, and
        aligning the central axis of the substrate with the rotational axis of the rotating mechanism.

2. The method according to claim 1, wherein
    in the holding of the flat portion of the substrate, a frictional force applied to the substrate by adsorption of the flat portion is greater than or equal to a centrifugal force applied to the substrate due to rotation of the substrate.

3. The method according to claim 1, wherein
    in the pressing of the outer surface with the push jig, the outer surface is pressed with a force greater than a frictional force applied to the substrate by adsorption of the flat portion.

4. The method according to claim 3, wherein
    in the pressing of the outer surface with the push jig, the outer surface is pressed with a force that does not exceed a strength of the substrate.

5. The method according to claim 1, wherein:
    the curved surface portion has a central axis passing through a center point of the curved surface portion, when viewed in a normal direction to the one surface, along the normal direction, and
    the irradiating includes:
        fixing the substrate,
        moving a laser beam irradiation unit, and
        irradiating the curved surface portion with the laser beam along a circumferential direction with respect to the central axis.

6. An apparatus for processing a micro-oscillator, comprising:
    a suction jig configured to suck a flat portion of a substrate having a curved surface portion surrounded by the flat portion and formed in a three-dimensional curved surface shape including a hemispherical shape protruding from one surface of the flat portion;
    a rotating mechanism configured to rotate the substrate sucked by the suction jig;
    a push jig having a head in contact with an outer surface of the curved surface portion of the substrate rotated by the rotating mechanism so as to adjust a rotational axis of the substrate; and
    a laser beam irradiation unit configured to irradiate the curved surface portion with a laser beam to cut the substrate.

* * * * *